(12) United States Patent
Kim et al.

(10) Patent No.: US 9,481,535 B2
(45) Date of Patent: Nov. 1, 2016

(54) METHOD FOR TRANSFERRING SUBSTRATE USING VACUUM ROLL-TO-ROLL DEVICE

(75) Inventors: Sang-Mi Kim, Yongin-si (KR); Gug Rae Jo, Asan-si (KR); Jae Hyuk Chang, Seongnam-si (KR); Seung-Jun Lee, Yongin-si (KR); Seung-Min Lee, Jeju-si (KR); Dae-Young Lee, Suwon-si (KR); Ki-Beom Lee, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 409 days.

(21) Appl. No.: 13/435,626

(22) Filed: Mar. 30, 2012

(65) Prior Publication Data

US 2013/0064978 A1 Mar. 14, 2013

(30) Foreign Application Priority Data

Sep. 14, 2011 (KR) .......................... 10-2011-0092525

(51) Int. Cl.
| | |
|---|---|
| D06B 23/18 | (2006.01) |
| C23C 16/54 | (2006.01) |
| C23C 14/56 | (2006.01) |
| B65H 18/10 | (2006.01) |
| B01J 3/02 | (2006.01) |
| B01J 3/03 | (2006.01) |
| B05C 11/115 | (2006.01) |

(52) U.S. Cl.
CPC ............... *B65H 18/103* (2013.01); *B01J 3/02* (2013.01); *B01J 3/03* (2013.01); *C23C 14/562* (2013.01); *C23C 14/564* (2013.01); *C23C 14/568* (2013.01); *C23C 16/545* (2013.01); *B05C 11/115* (2013.01); *B65H 2301/41487* (2013.01); *B65H 2801/61* (2013.01); *D06B 23/18* (2013.01)

(58) Field of Classification Search
None
See application file for complete search history.

(56) References Cited

U.S. PATENT DOCUMENTS

| | | | | |
|---|---|---|---|---|
| 3,032,890 | A | * | 5/1962 | Brick .................... C23C 14/562 134/122 R |
| 3,040,702 | A | * | 6/1962 | Eng et al. ...................... 118/718 |
| 3,084,448 | A | * | 4/1963 | Dungler .......................... 34/634 |
| 3,939,576 | A | * | 2/1976 | Lawrence ........................ 34/242 |
| 4,064,582 | A | * | 12/1977 | Sando et al. ..................... 34/242 |
| 4,301,665 | A | * | 11/1981 | Lopata ............................ 34/242 |
| 5,945,351 | A | | 8/1999 | Mathuni |
| 5,951,835 | A | * | 9/1999 | Namiki et al. ................. 118/718 |
| 2005/0064215 | A1 | * | 3/2005 | Hultin Stigenberg ............ C23C 14/022 428/469 |
| 2007/0224350 | A1 | * | 9/2007 | Schuisky ....................... 118/718 |

FOREIGN PATENT DOCUMENTS

| | | |
|---|---|---|
| JP | 07221025 A | 8/1995 |
| JP | 2000218482 A | 8/2000 |
| JP | 2004281617 A | 10/2004 |
| JP | 2005123492 A | 5/2005 |
| JP | 2008156151 A | 7/2008 |
| KR | 100322456 B | 1/2002 |
| KR | 100884994 B | 2/2009 |
| KR | 100920479 B | 9/2009 |

* cited by examiner

*Primary Examiner* — Binu Thomas
(74) *Attorney, Agent, or Firm* — Cantor Colburn LLP

(57) ABSTRACT

A vacuum roll-to-roll device includes: a first chamber; a second chamber neighboring the first chamber; a shutter disposed between the first chamber and the second chamber; a sealing member attached to the shutter; and a roll-type substrate which moves from the first chamber to the second chamber through the sealing member. A thickness of a lateral side of the roll-type substrate decreases in a direction toward an edge thereof.

9 Claims, 11 Drawing Sheets

METHOD FOR TRANSFERRING SUBSTRATE USING VACUUM ROLL-TO-ROLL DEVICE

This application claims priority to Korean Patent Application No. 10-2011-0092525 filed on Sep. 14, 2011, and all the benefits accruing therefrom under 35 U.S.C. §119, the entire contents of which are incorporated herein by reference.

BACKGROUND OF THE INVENTION (a) Field of the Invention

The invention relates to a vacuum roll-to-roll device and a manufacturing method of a roll-type substrate.

(b) Description of the Related Art

Attention to a flexible display device that is light and flexible and maintains device characteristics has been substantially increased together with rapid technique development of a display device. For a mass production of a low cost and high speed flexible display device, a continuous roll-to-roll process is necessary, rather than a batch type process that is based on a conventional glass substrate.

The roll-to-roll process is a process for executing formation of a thin film while unwinding/rewinding a polymer substrate made of a material such as polyethylene terephthalate ("PET"), polyethylene naphthalate ("PEN"), and polyethersulfone ("PES") used to manufacture the flexible display device through an unwinding/rewinding roller, and has been largely researched as a high speed and mass production method for the flexible photoelectronic device of a next generation.

The process for forming the thin film may be generally executed in a high vacuum chamber. In the state that the roll-type substrate is placed inside the vacuum chamber, a shutter of the chamber is closed and air is withdrawn by a vacuum pump to form a vacuum. However, inflow of air is generated by minute cracks at an edge portion where the roll-type substrate and an O-ring of the shutter meet each other such that the vacuum degree inside the chamber is decreased.

BRIEF SUMMARY OF THE INVENTION

The invention provides a vacuum roll-to-roll device and a manufacturing method of a roll-type substrate to increase a vacuum degree of the vacuum roll-to-roll device.

A vacuum roll-to-roll device according to the invention includes: a first chamber; a second chamber neighboring the first chamber; a shutter disposed between the first chamber and the second chamber; and a sealing member attached to the shutter, and through which a roll-type substrate moves from the first chamber to the second chamber. A thickness of a lateral side of the roll-type substrate decreases in a direction toward an edge thereof.

The thickness of both of opposing lateral sides of the roll-type substrate decreases in a first direction, and the first direction may be substantially perpendicular to a direction in which the roll-type substrate moves from the first chamber to the second chamber.

The second chamber may form a large vacuum compared with the first chamber.

The sealing member may include a lower sealing member and an upper sealing member, and the shutter is closed when the lower sealing member and the upper sealing member contact each other and contact the roll-type substrate.

A portion of both of the opposing lateral sides of the roll-type substrate may contact the sealing member when the shutter is closed.

A separated space may be generated between the lower sealing member and the upper sealing member by a thickness of the roll-type substrate when the shutter is closed, and an edge portion of the roll-type substrate may fill the separated space.

The cross-sectional shape of the edge of the roll-type substrate may be a curved line.

The sealing member may be an O-ring of a rubber material.

A method of manufacturing a roll-type substrate according to the invention includes: unwinding a flexible substrate from an unwinding roller; cutting a lateral side of the flexible substrate by using a first cutter; and rewinding the flexible substrate of which the lateral side is cut through a rewinding roller. A knife portion of the first cutter is inclined at a portion which meets the flexible substrate.

The cutting of the lateral side of the flexible substrate may include cutting the lateral side of the flexible substrate by simultaneously using a second cutter which faces the first cutter with respect to the flexible substrate.

The knife portion of the first cutter and a knife portion of the second cutter may be disposed to meet the same position of the flexible substrate.

In the cutting of the lateral side of the flexible substrate, a thickness of a lateral side of the flexible substrate may decrease in a direction toward the edge thereof.

The thickness of both of opposing lateral sides of the flexible substrate may decrease in a first direction substantially perpendicular to an unwinding direction of the flexible substrate.

The first cutter includes two knife portions attached to a cylindrical body.

The two knife portions may be inclined at a portion which meets the flexible substrate.

The lateral side of the flexible substrate may be cut while rolling the cylindrical body of the first cutter in an opposite direction to an unwinding direction of the flexible substrate.

As above described, according to an exemplary embodiment of the invention, air which is inflowed to an inside the high vacuum chamber may be minimized by changing the design of one or both of opposing sides of the roll-type substrate.

BRIEF DESCRIPTION OF THE DRAWINGS

The above and other aspects and features of this disclosure will become more apparent by describing in further detail exemplary embodiments thereof with reference to the accompanying drawings, in which.

DETAILED DESCRIPTION OF THE INVENTION

Figure 1:
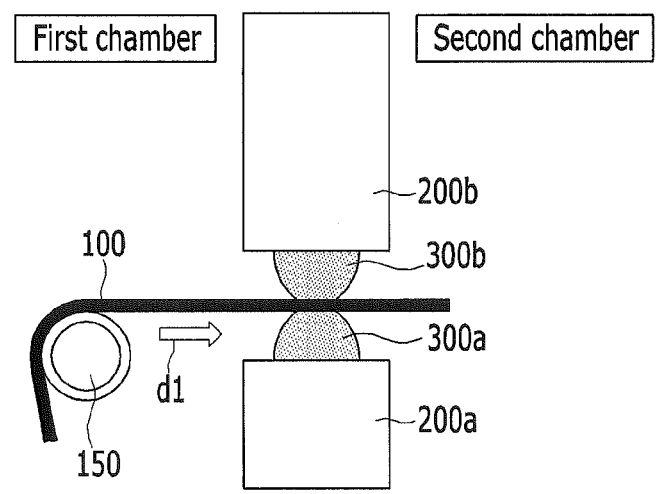
FIG. 1 is a cross-sectional view of an exemplary embodiment of a vacuum roll-to-roll device according to the invention.

Exemplary embodiments of the invention will be described in detail with reference to the accompanying drawings. However, the invention is not limited to exemplary embodiments described herein, and may be embodied in other forms. Rather, exemplary embodiments described herein are provided to thoroughly and completely understand the disclosed contents and to sufficiently transfer the ideas of the invention to a person of ordinary skill in the art.

In the drawings, the thickness of layers and regions is exaggerated for clarity. It is to be noted that when a layer is referred to as being "on" another layer or substrate, it can be directly formed on another layer or substrate or can be formed on another layer or substrate through a third layer interposed therebetween. In contrast, when an element is referred to as being "directly on" another element or layer, there are no intervening elements or layers present. Like constituent elements are denoted by like reference numerals throughout the specification. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" or "under" relative to other elements or features would then be oriented "above" relative to the other elements or features. Thus, the exemplary term "under" can encompass both an orientation of above and under. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the invention will be described in detail with reference to the accompanying drawings.

Figure 2:
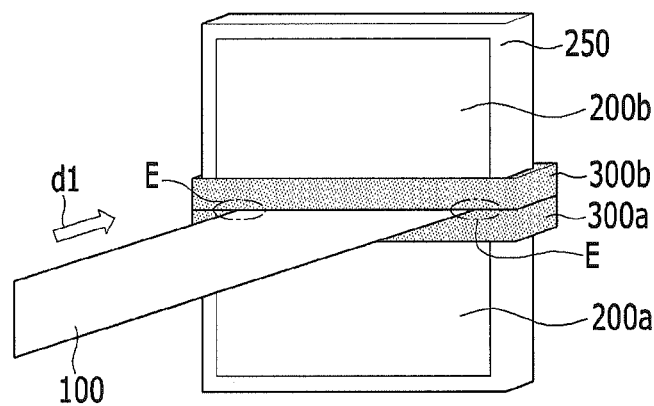
FIG. 2 is a perspective view of the vacuum roll-to-roll device according to the invention.

FIG. 1 is a cross-sectional view of an exemplary embodiment of a vacuum roll-to-roll device according to the invention. FIG. 2 is a perspective view of the vacuum roll-to-roll device according to the invention.

Referring to FIG. 1 and FIG. 2, an exemplary embodiment of a vacuum roll-to-roll device according to the invention includes a first chamber and a second chamber. The first chamber and the second chamber face each other, and shutters 200a and 200b are disposed between the first chamber and the second chamber. The shutters 200a and 200b form boundaries of the first chamber and the second chamber and may be enclosed by a frame 250. The second chamber may form a larger vacuum compared with the first chamber. The first chamber and the second chamber may be portions of one chamber that is spatially divided by the shutters.

The first chamber may be a load lock chamber which forms an environment for inserting a substrate into a process chamber before the substrate is inserted into the process chamber, and the second chamber may be a transfer chamber installed with a robot arm for transferring the substrate inside the first load lock chamber to the process chamber or transferring the substrate inside the process chamber to the first load lock chamber. However, the first chamber is not limited to the load lock chamber and the second chamber is not limited to the transfer chamber, and the second chamber may be applied to a case requiring a large vacuum.

A moving path is formed between the first chamber and the second chamber by an operation of opening and closing the shutters 200a and 200b. Sealing members 300a and 300b are attached to the shutters 200a and 200b, respectively. In the exemplary embodiment, the sealing members 300a and 300b may be O-rings, however they are not limited thereto. The O-rings 300a and 300b may include a rubber material.

In the vacuum roll-to-roll device according to the exemplary embodiment, the roll-type substrate 100 is unrolled by a driving roller 150. The roll-type substrate 100 may be a flexible plastic substrate. The roll-type substrate 100 passes between the O-rings 300a and 300b according to a rotation of the driving roller 150 in a state that the shutters 200a and 200b are opened. Accordingly, the roll-type substrate 100 moves from the first chamber to the second chamber in a first direction d1.

FIG. 1 and FIG. 2 show a state that the shutters 200a and 200b are closed after a predetermined portion of the roll-type substrate 100 is moved into the second chamber in the first direction d1.

Figure 3:
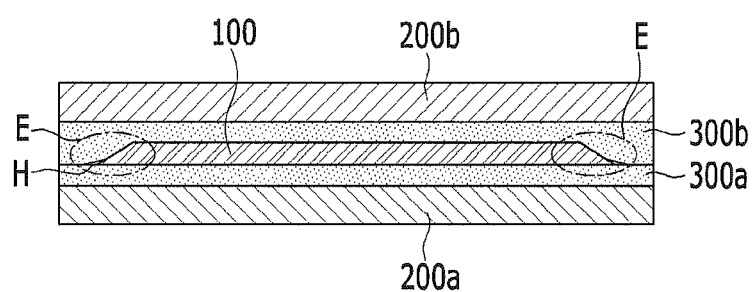
FIG. 3 is a cross-sectional view of an exemplary embodiment of a shutter portion of a vacuum roll-to-roll device according to the invention.

FIG. 3 is a cross-sectional view of an exemplary embodiment of a shutter portion of a vacuum roll-to-roll device according to the invention.

Referring to FIG. 3, the lower O-ring 300a is attached directly to the upper surface of the lower shutter 200a, and the upper O-ring 300b is attached directly to the lower surface of the upper shutter 200b. FIG. 3 shows a state that the shutters 200a and 200b are closed.

The roll-type substrate 100 is interposed between the lower O-ring 300a and the upper O-ring 300b. The cross-section of a lateral side portion E of the roll-type substrate 100 according to the exemplary embodiment is tapered. While the shutters 200a and 200b are closed and the O-rings 300a and 300b are held against the roll-type substrate 100, the shape of the O-rings 300a and 300b is changed or deformed by the thickness of the roll-type substrate 100. A separated space H may be generated between the changed portion of the O-rings 300a and/or 300b and the edge of the roll-type substrate 100. However, the cross-sectional surface of the lateral side portion E of the roll-type substrate 100 according to the exemplary embodiment is tapered such that the separated space H is minimized. In other word, the edge portion of the roll-type substrate 100 fills the separated space H.

In another exemplary embodiment, the cross-section of the lateral side portion E of the roll-type substrate 100 may be a curved line.

Figure 4:
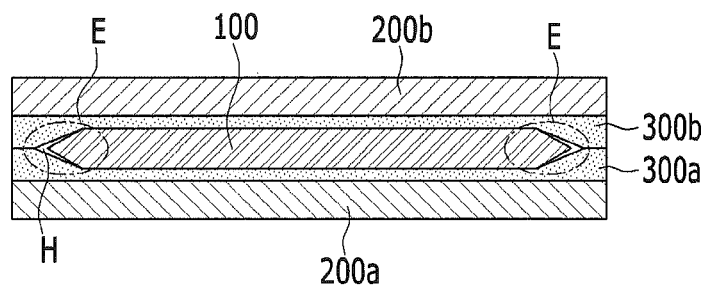
FIG. 4 is a cross-sectional view of another exemplary embodiment of a shutter portion of a vacuum roll-to-roll device according to the invention.

FIG. 4 is a cross-sectional view of another exemplary embodiment of a shutter portion of a vacuum roll-to-roll device according to the invention.

Most of the constitutions according to the exemplary embodiment shown in FIG. 4 are similar to the exemplary embodiment shown in FIG. 3, and differences will be described. The description in FIG. 3 may be applied to the remaining constitutions except for the differences.

Referring to FIG. 4, the cross-section of the lateral side portion E of the roll-type substrate 100 according to the exemplary embodiment has two tapers.

The lateral side portion E of the roll-type substrate 100 meets the lower O-ring 300a and the upper O-ring 300b. In the exemplary embodiment, the edge portion of the roll-type substrate 100 fills the larger space H compared with the exemplary embodiment descried in FIG. 3.

In another exemplary embodiment, the cross-section of the edge lateral side portion E of the roll-type substrate 100 may be formed by engaging two curved lines.

Figure 5:
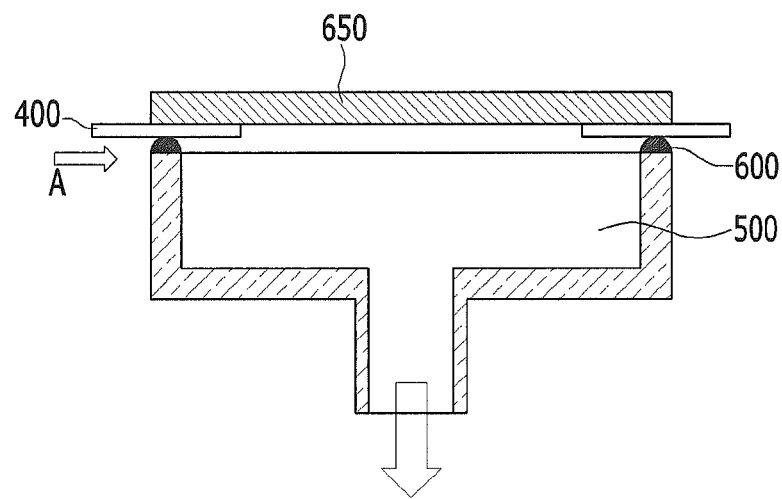
FIG. 5 and FIG. 6 are cross-sectional views of an exemplary embodiment of a change of a vacuum degree of a vacuum roll-to-roll device according to the invention.
Figure 6:
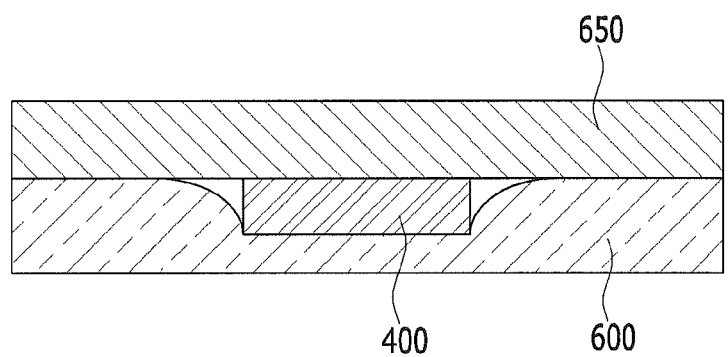

FIG. 5 and FIG. 6 are cross-sectional views showing an exemplary embodiment of a change of a vacuum degree of a vacuum roll-to-roll device according to the invention. FIG. 6 is a cross-sectional view in the second direction A in the experimental example of FIG. 5.

Referring to FIG. 5 and FIG. 6, to verify how the vacuum degree is changed according to the magnitude of the separated space between the O-ring and the roll-type substrate edge, an aluminum foil 400 having a predetermined thickness is put on a chamber 500, a cover 650 covers (e.g., overlaps) the chamber 500, and an inlet is formed between the chamber 500 and the cover 650. An O-ring 600 is disposed between the aluminum foil 400 and the wall of the chamber.

In the above configuration, a vacuum state is formed inside the chamber 500 by using a vacuum pump (not shown). The time to change the pressure inside the chamber to a vacuum state is then measured. This experiment is repeated while changing the thickness of the aluminum foil 400, and the results thereof are shown in FIG. 7.

Figure 7:
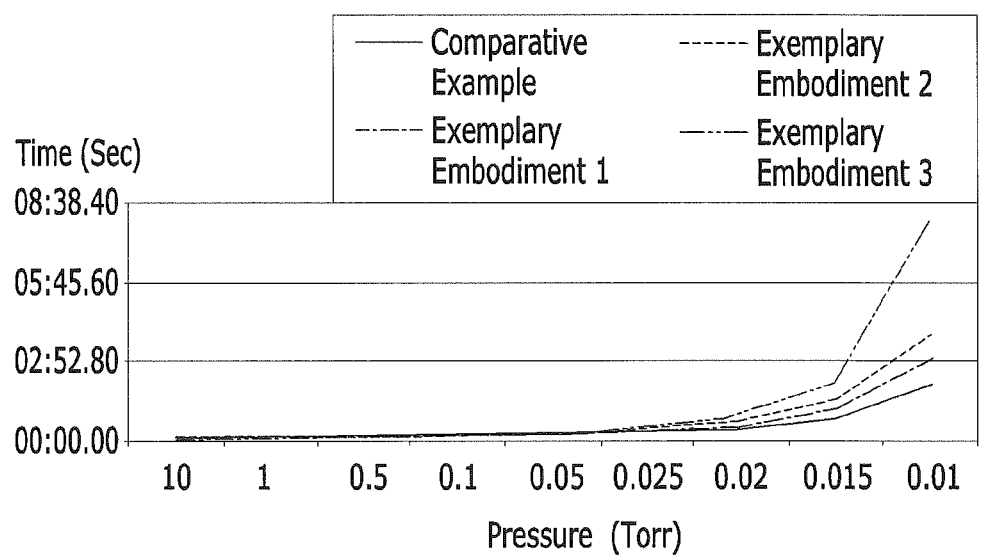
FIG. 7 is a graph of a change of the vacuum degree according to the exemplary embodiment of FIG. 5 and FIG. 6.

FIG. 7 is a graph showing a change of the vacuum degree of the exemplary embodiment of FIG. 5 and FIG. 6 according to the invention. The time to change the pressure in seconds (Sec) is plotted against the change of pressure in torr (Torr).

Firstly, the vacuum degree is measured through Comparative Example 1 where the aluminum foil is not provided, an Exemplary Embodiment 1 where one sheet of the aluminum foil 400 having a thickness of 15 micrometers (um) is provided, an Exemplary Embodiment 2 where two sheets of the aluminum foil 400 having a thickness of 15 µm are provided, and an Exemplary Embodiment 3 where four sheets of the aluminum foil 400 having a thickness of 15 µm are provided.

Referring to FIG. 7, as the number of aluminum foil sheets is increased, the time for forming the vacuum state is increased. That is, as the number of aluminum foil sheets is increased, a step formed in the O-ring is increased such that the separated space between the O-ring and the roll-type substrate edge is increased.

Figure 8:
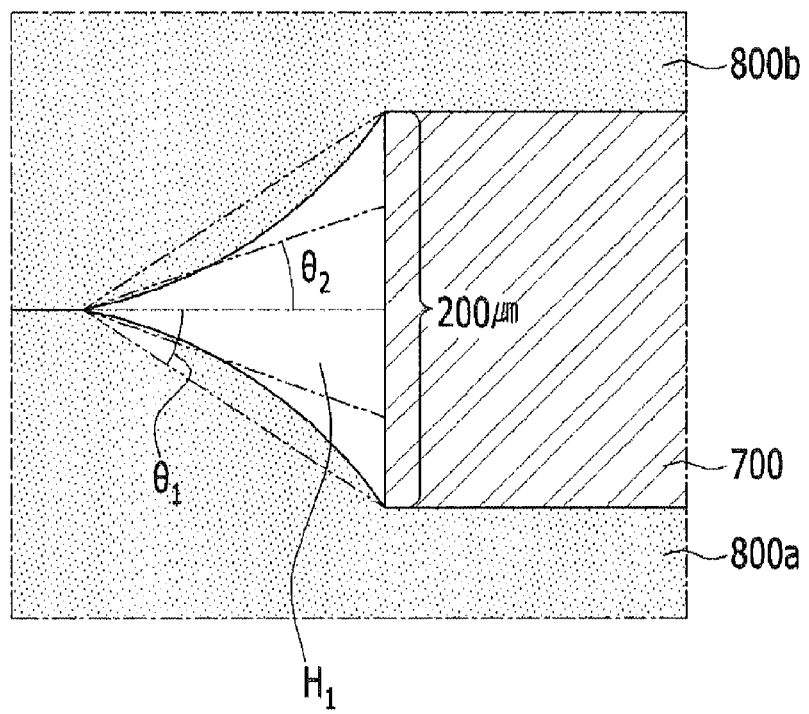
FIG. 8 is a cross-sectional view of an air leakage space of a shutter portion of a conventional vacuum roll-to-roll device.

FIG. 8 is a cross-sectional view of an air leakage space of a shutter portion of a conventional vacuum roll-to-roll device.

Referring to FIG. 8, the lateral side of the roll-type substrate 700 of the conventional vacuum roll-to-roll device has a surface that is substantially perpendicular to the upper surface of the substrate 700. If the thickness of the roll-type substrate 700 is about 200 µm in a third direction, and is a plastic substrate, the area of the separated space $H_1$ may be calculated as follows.

A maximum angle $\theta_1$ is respectively between O-rings 800a and 800b, and a normal line to the substrate 700. When the angle $\theta_1$ of O-rings 800a and 800b is about 30 degrees in FIG. 8, the area of the separated space $H_1$ is about 17,320 square micrometers ($\mu m^2$). A minimum angle $\theta_2$ is respectively between O-rings 800a and 800b, and the normal line. When the angle $\theta_2$ of the O-rings 800a and 800b is about 15 degrees, the area of the separated space $H_1$ is about 8,038 $\mu m^2$. Accordingly, the area of the cross-section of the separated space $H_1$ respectively formed between the O-rings

800a and 800b and the edge portion of the roll-type substrate 700, may be in the range of about 8,038 μm² to about 17,320 μm².

Figure 9:
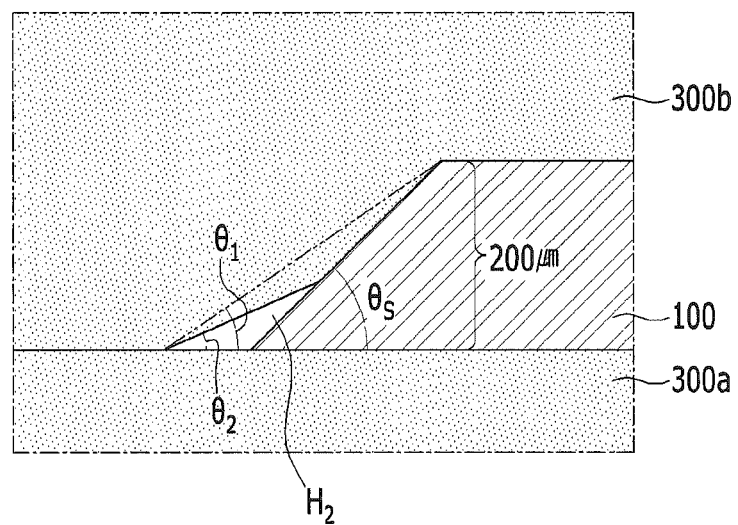
FIG. 9 is a cross-sectional view of an air leakage space of an exemplary embodiment of a shutter portion of a vacuum roll-to-roll device according to the invention.

FIG. 9 is a cross-sectional view of an exemplary embodiment of an air leakage space of a shutter portion of a vacuum roll-to-roll device according to the invention.

Referring to FIG. 9, the cross-section of the exemplary embodiment of the roll-type substrate 100 of the vacuum roll-to-roll device according to the invention is tapered. If the thickness of the roll-type substrate 100 is about 200 μm in the third direction and is a plastic substrate, and the taper angle $\theta_s$ is about 45 degrees, the area of the separated space $H_2$ may be calculated as follows.

A maximum angle $\theta_1$ is between deformed O-ring 300b and O-ring 300a. If the angle $\theta_1$ of the O-rings 300a and 300b is about 30 degrees in FIG. 9, the area of the separated space $H_2$ may be calculated as follows.

The area of the separated space $H_2=\frac{1}{2}*200*400*\sin(60$ degrees$)-\frac{1}{2}200*200=$about 14,641 μm².

A minimum angle $\theta_2$ is between deformed O-ring 300b and O-ring 300a. If the angle $\theta_2$ of the O-rings 300a and 300b is about 15 degrees in FIG. 9, the area of the separated space $H_2$ may be calculated as follows.

The area of the separated space $H_2=14,641-\frac{1}{2}*400*200*\tan(15$ degrees$)=$about 3,923 μm².

Accordingly, the area of the cross-section of the separated space $H_2$ formed between the O-rings 300a and 300b and the edge portion of the roll-type substrate 100 may be in the range of about 3,923 μm² to about 14,641 μm².

Figure 10:
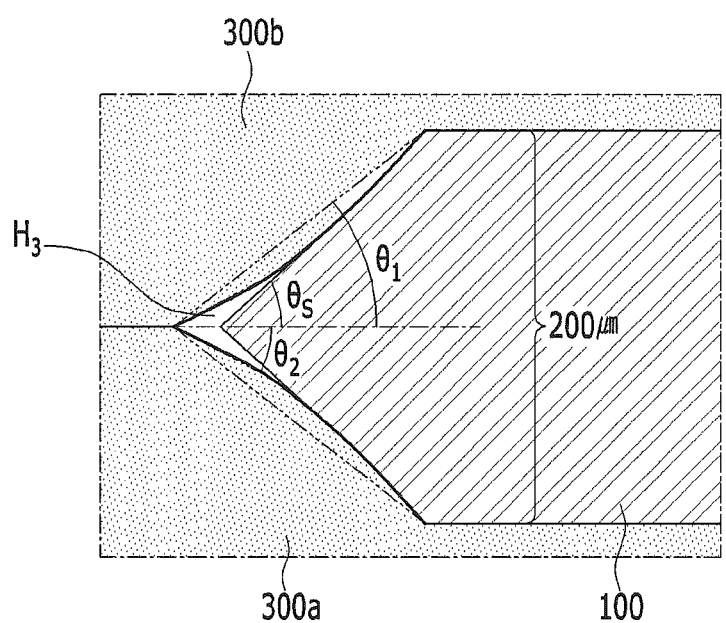
FIG. 10 is a cross-sectional view of an air leakage space of another exemplary embodiment of a shutter portion of a vacuum roll-to-roll device according to the invention.

FIG. 10 is a cross-sectional view of another exemplary embodiment of an air leakage space of a shutter portion of a vacuum roll-to-roll device according to the invention.

Referring to FIG. 10, the exemplary embodiment of the cross-section of the roll-type substrate 100 of the vacuum roll-to-roll device according to the invention is double-tapered. If the thickness of the roll-type substrate 100 is about 200 μm in the third direction and is a plastic substrate, and the taper angle $\theta_s$ is about 45 degrees, the area of the separated space $H_3$ may be calculated as follows.

A maximum angle $\theta_1$ is respectively between O-rings 300a and 300b, and a normal line to the substrate 100. If the angle $\theta_1$ of the O-rings 300a and 300b is about 30 degrees in FIG. 10, the area of the separated space $H_3$ may be calculated as follows.

The area of the separated space $H_3=\frac{1}{2}*200*200*\sin(60$ degrees$)-1001*100=$about 7,323.5 μm².

A minimum angle $\theta_2$ is respectively between O-rings 300a and 300b, and a normal line to the substrate 100. If the angle $\theta_2$ of the O-rings 300a and 300b is about 15 degrees in FIG. 10, the area of the separated space $H_3$ may be calculated as follows.

The area of the separated space $H_3=7323.5-2*\frac{1}{2}200*100*\tan(15$ degrees$)=$about 1,961.5 μm².

Accordingly, the area of the cross-section of the separated space $H_3$ respectively formed between the O-rings 800a and 800b and the edge portion of the roll-type substrate 100 may be in the range of about 1,961.5 μm² to about 7,323.5 μm².

Referring to FIG. 8 to FIG. 10, the area of the cross-section of the separated space is changed according to the design of the roll-type substrate, and it is possible to reduce the magnitude thereof.

In one exemplary embodiment, of the taper angle of the edge of the roll-type substrate and the physical property of the O-ring, an elastic coefficient tends to be proportional to a width of the separated space and tends to be inversely proportional to a force which closes the shutter. Accordingly, when the angle of the O-ring by the physical property of the O-ring and the force for closing the shutter is referred to as θ, and the taper angle of the roll-type substrate is referred to as $\theta_s$, if θ and $\theta_s$ are ideally equal to each other, the area of the separated space in the third direction (e.g., thickness direction of the substrate) becomes 0 such that no air leakage will occur.

In other words, the taper angle of the roll-type substrate and the angle of the deformed O-ring are synchronized by controlling the physical property and the structure of the O-ring such that the magnitude of the separated space formed between the O-ring and the roll-type substrate is minimized. Accordingly, the air flowing into the high vacuum chamber may be minimized.

Figure 11:
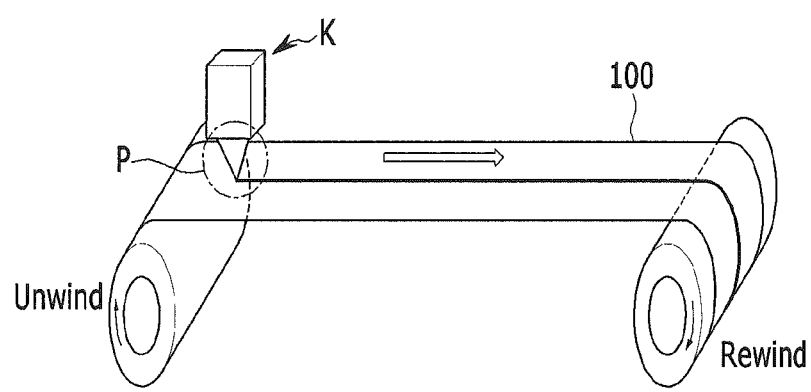
FIG. 11 is a perspective view of an exemplary embodiment of a manufacturing method of a roll-type substrate used for a vacuum roll-to-roll device according to the present invention.
Figure 12:
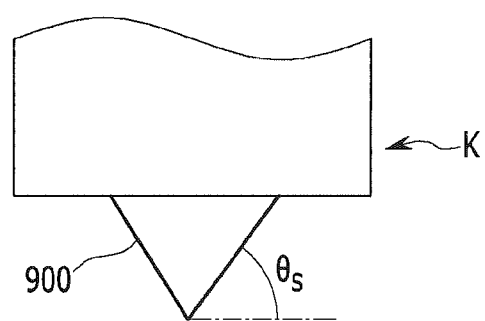
FIG. 12 is an enlarged cross-sectional view of portion P of FIG. 11.

FIG. 11 is a perspective view of an exemplary embodiment of a manufacturing method of a roll-type substrate used in a vacuum roll-to-roll device according to the invention. FIG. 12 is an enlarged cross-sectional view of portion P of FIG. 11.

Referring to FIG. 11, an exemplary embodiment of a manufacturing method of a roll-type substrate according to the invention includes unwinding a flexible substrate 100 from an unwinding roller, cutting a lateral side of the substrate 100 in an opposite direction to a progressing direction (an arrow direction of FIG. 11) of the substrate 100 of by using a cutter K including a knife having an oblique line shape, and rewinding the roll-type substrate 100 of which the lateral side is cut through the rewinding roller.

Referring to FIG. 12, the cutter K according to the exemplary embodiment is similar to a triangle knife used for engraving, and the knife portion 900 of the cutter K forms the angle $\theta_s$ with respect to the upper surface of the substrate 100. Accordingly, the lateral side of the roll-type substrate 100 cut by the cutter K is tapered with the angle $\theta_s$. The roll-type substrate 100 formed as described above forms the shape like the exemplary embodiment described in FIG. 3.

Figure 13:
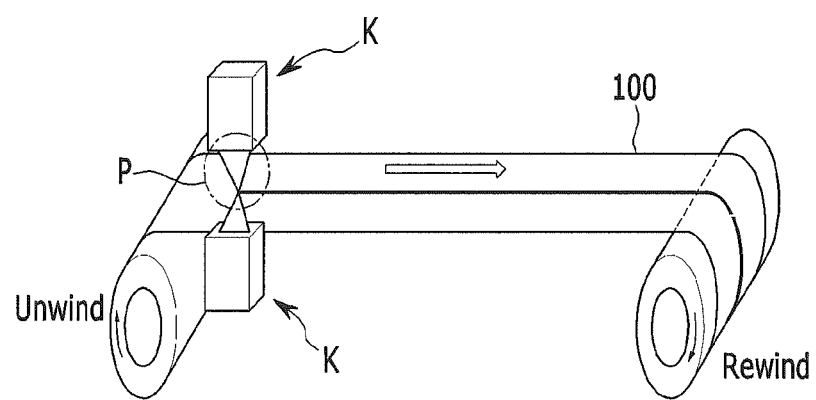
FIG. 13 is a perspective view of another exemplary embodiment of a manufacturing method of a roll-type substrate used in a vacuum roll-to-roll device according to the invention.

FIG. 13 is a perspective view of another exemplary embodiment of a manufacturing method of a roll-type substrate used in a vacuum roll-to-roll device according to the invention.

Referring to FIG. 13, an exemplary embodiment of the manufacturing method of the roll-type substrate in FIG. 13 is almost the same as the exemplary embodiment described in FIG. 11 and FIG. 12. However, the lateral side of the substrate 100 is cut in the opposite direction to the progressing direction (the arrow direction of FIG. 12) of the substrate 100 by simultaneously using a plurality of cutters K above and under the substrate 100. As described above, the roll-type substrate 100 forms the tapered lateral side portions having the shape like the exemplary embodiment described in FIG. 4.

Figure 14:
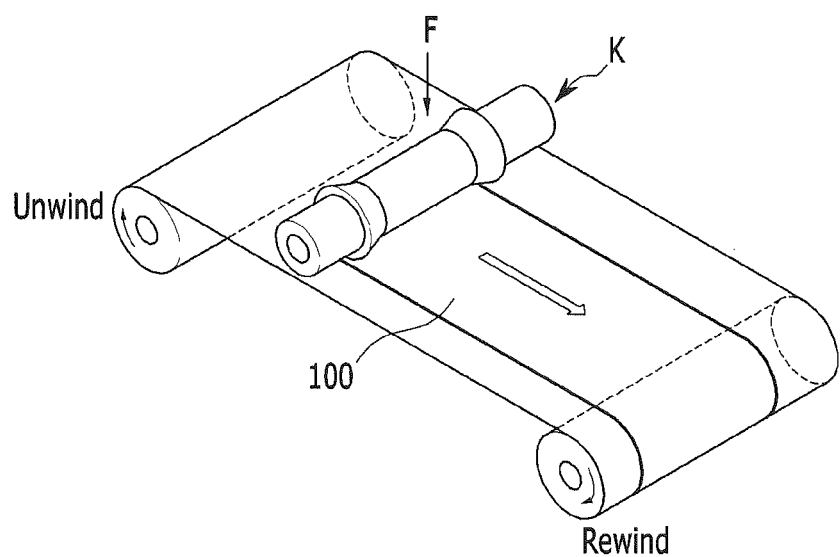
FIG. 14 is a perspective view of another exemplary embodiment of a manufacturing method of a roll-type substrate used in a vacuum roll-to-roll device according to the invention.
Figure 15:
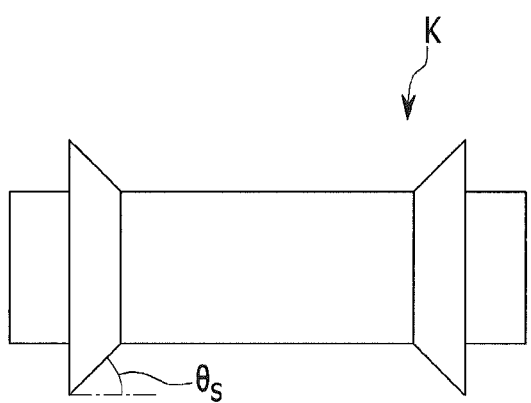
FIG. 15 is a front view in a direction F of FIG. 14.

FIG. 14 is a perspective view of another exemplary embodiment of a manufacturing method of a roll-type substrate used in a vacuum roll-to-roll device according to the invention. FIG. 15 is a front view in a direction F of FIG. 14.

Referring to FIG. 14 and FIG. 15, most of the description of the exemplary embodiment described in FIG. 11 and FIG. 12 is applied to the exemplary embodiment, however the overall shape of the cutter K has differences. In the exemplary embodiment, the cutter K includes a cylindrical body and two knife portions attached to the cylindrical body. The knife portion forms the angle $\theta_s$ with respect to the upper surface of the substrate 100. Accordingly, the lateral side of the roll-type substrate 100 that is cut by the cutter K is tapered with the angle $\theta_s$. Also, the lateral side of the substrate 100 may be cut while rolling the cylindrical body in the opposite direction to the progressing direction (the arrow direction of FIG. 14) of the substrate 100 by using the cylindrical body of the cutter K.

Here, two knife portions are set to be inclined in different directions at the portions meeting the substrate 100. In other words, two knife portions may be inclined to be substantially symmetrical to each other.

Figure 16:
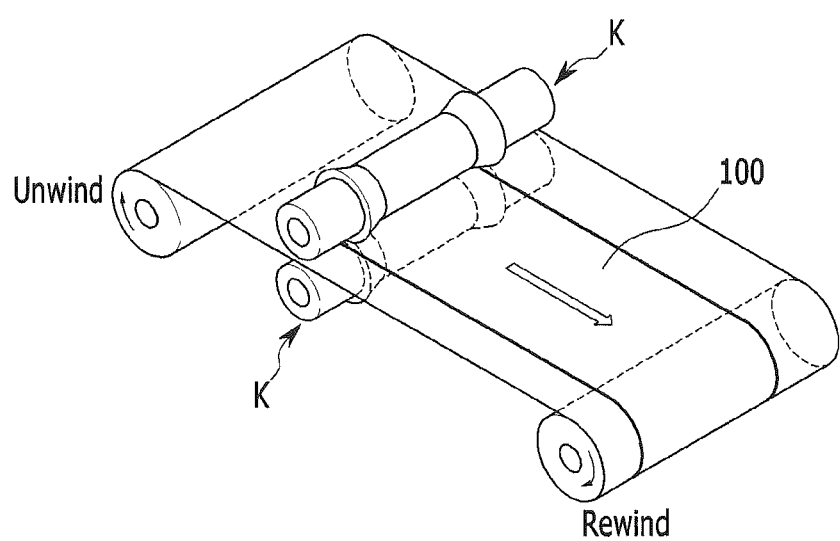
FIG. 16 is a perspective view of another exemplary embodiment of a manufacturing method of a roll-type substrate used in a vacuum roll-to-roll device according to the invention.

FIG. 16 is a perspective view of another exemplary embodiment of a manufacturing method of a roll-type substrate used in a vacuum roll-to-roll device according to the invention.

Referring to FIG. 16, the manufacturing method of the roll-type substrate according to the exemplary embodiment is almost the same as the exemplary embodiment described in FIG. 14 and FIG. 15. However, the lateral side of the substrate 100 is cut in the opposite direction to the progressing direction (the arrow direction of FIG. 16) of the substrate 100 by simultaneously using a plurality of cutters K above and under the substrate 100.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for transferring a substrate by using a vacuum roll-to-roll device, comprising:
   unrolling the substrate from a roller;
   transferring the substrate from a first chamber to a second chamber which is adjacent to the first chamber while a shutter between the first chamber and the second chamber is open; and
   closing the shutter so that a sealing member protruded from the shutter contacts upper and lower surfaces of the substrate,
   wherein a thickness of a lateral side of the substrate decreases to an edge thereof to define a tapered lateral side surface of the substrate, the tapered lateral side surface connecting upper and lower surfaces of the substrate; and
   wherein in a closed state of the shutter, the sealing member defines:
      a first portion thereof contacting the upper surface of the substrate, the first portion defining a first thickness of the sealing member,
      a second portion thereof extending directly from the first portion toward the tapered lateral side surface of the substrate to directly contact the substrate, and
      a third portion thereof extending directly from the second portion and away from the substrate to be disposed outside the tapered lateral side surface of the substrate, the third portion defining a third thickness of the sealing member greater than the first thickness,
   wherein the second portion directly contacting the substrate defines a second thickness of the sealing member, the second thickness being greater than the first thickness and less than the third thicknesses, and
   the second portion defining the second thickness faces and contacts the tapered lateral side surface of the substrate.

2. The method for transferring a substrate by using a vacuum roll-to-roll device of claim 1, wherein
   the thickness of both of opposing lateral sides of the substrate decreases in a first direction to define opposing tapered lateral side surfaces of the substrate of the vacuum roll-to-roll device, and
   a direction in which the substrate moves from the first chamber to the second chamber is defined substantially perpendicular to the first direction in which the opposing tapered lateral side surfaces of the unwound substrate is defined.

3. The method for transferring a substrate by using a vacuum roll-to-roll device of claim 2, wherein
   a degree of vacuum in the second chamber is larger than a degree of vacuum in the first chamber.

4. The method for transferring a substrate by using a vacuum roll-to-roll device of claim 3, wherein
   the sealing member comprises a lower sealing member and an upper sealing member, and
   in the closed state of the shutter, the lower sealing member and the upper sealing member contact each other and directly contact the substrate.

5. The method for transferring a substrate by using a vacuum roll-to-roll device of claim 4, wherein
   a portion of both of the opposing tapered lateral side surfaces of the substrate contacts the second portion of the sealing member, when the shutter is in the closed state.

6. The method for transferring a substrate by using a vacuum roll-to-roll device of claim 1, wherein
   the sealing member comprises a lower sealing member and an upper sealing member,
   for the second portion of the sealing member, a space is defined between the lower sealing member and the upper sealing member when the shutter is in the closed state, and
   an edge portion including the tapered lateral side surface of the substrate is in the space.

7. The method for transferring a substrate by using a vacuum roll-to-roll device of claim 1, wherein
   the thickness of both of opposing lateral sides of the substrate decreases in a first direction to define a curved line shape of opposing lateral side surfaces of the substrate in a cross-section; and
   a direction in which the substrate moves from the first chamber to the second chamber is defined substantially perpendicular to the first direction in which the curved line shape of the opposing lateral side surfaces of the substrate is defined.

8. The method for transferring a substrate by using a vacuum roll-to-roll device of claim 1, wherein
   the sealing member includes an O-ring of a rubber material.

9. The method for transferring a substrate by using a vacuum roll-to-roll device of claim 1, wherein
   a direction of transferring the substrate is substantially perpendicular to a direction of decreasing the thickness of the lateral side of the substrate.

* * * * *